United States Patent [19]

Webster et al.

[11] Patent Number: 5,041,746
[45] Date of Patent: Aug. 20, 1991

[54] SENSE AMPLIFIER PROVIDING A RAPID OUTPUT TRANSITION

[75] Inventors: William S. Webster; Daniel D. Edmondson, both of Dallas, Tex.

[73] Assignee: Texas Instruments Incorporated, Dallas, Tex.

[21] Appl. No.: 453,635

[22] Filed: Dec. 20, 1989

[51] Int. Cl.⁵ .......................................... H03R 17/04
[52] U.S. Cl. .................................. 307/530; 307/451; 307/468; 365/189.11
[58] Field of Search ................. 307/443, 449, 450–451, 307/468–469, 350, 530, 303.2; 365/189.11, 205

[56] References Cited

U.S. PATENT DOCUMENTS

| | | | |
|---|---|---|---|
| 4,404,474 | 9/1983 | Dingwall | 307/449 X |
| 4,433,257 | 2/1984 | Kinoshita | 307/296.8 X |
| 4,471,240 | 9/1984 | Novosel | 307/449 X |
| 4,728,827 | 3/1988 | Woo | 307/443 X |
| 4,880,997 | 11/1989 | Steele | 307/443 |
| 4,899,070 | 2/1990 | Ou et al. | 307/530 |

Primary Examiner—David Hudspeth
Attorney, Agent, or Firm—B. Peter Barndt; James T. Comfort; Melvin Sharp

[57] ABSTRACT

A sense amplifier (38) uses a current source (40) to pull-up a product line (14) during as low-to-high transition. After a desired voltage is reached on the product line (14), the current source is turned off by a delay feedback circuit (44). A hold-up circuit (42) holds the product line at the desired voltage until a high-to-low transition occurs.

38 Claims, 3 Drawing Sheets

SENSE AMPLIFIER PROVIDING A RAPID OUTPUT TRANSITION

RELATED APPLICATIONS

This application is related to co-pending Application entitled "Sense Circuitry", by Rohit L. Bhuva, Ser. No. 446,741, filed Dec. 6, 1989, incorporated herein by reference.

TECHNICAL FIELD OF THE INVENTION

This invention relates in general to integrated circuits, and more particularly to a sense amplifier.

BACKGROUND OF THE INVENTION

Electrically programmable array logic (EPALs) use a plurality of FAMOS transistors having gates coupled to input signals and source/drain region coupled between a product line and ground to implement logic functions. Sense amplifiers, which detect logic levels on the product line, may pull the product line to a voltage which will result in preventing premature FAMOS data gain. Previously developed sense amplifiers use a stacked transistor design to achieve the required pull-up. The operating point of the two transistors moves along the edge of the linear and saturated region, thus operating like a resistive pull-up. The current supplied by the stacked transistor pull-up will therefore be dependent upon the voltage of the product line. The higher the product line voltage, the lower the current supplied. When the product line's voltage approaches the clamp voltage, the current diminishes greatly. This effect may be great enough to skew the output transitions, making the low-to-high transitions slower than the high-to-low transitions, even though the FAMOS cell will sink increasing current with the decreasing product line voltage when it is pulling the line low.

The stacked transistor design must also be highly intolerant to process variations. If the N-channel transistors are weakened through any kind of parameters changes, such as VTO, BE (body effects), or KP, the performance of the sense amplifier will be greatly altered. The trip point of the CMOS inverter sense amplifier will also be skewed with process variations which can work against the slowest transition, and may even cause threshold problems.

Other sense amplifiers utilize a resistor divider type of pull-up to achieve the low voltage "high" required to prevent premature FAMOS data gain. In this design, a reference voltage tracks with process variations to control N-channel and P-channel fluctuations.

The low-to-high transition of such sense amplifiers is sacrificed by the pull-down resistor divider. The higher the product line voltage, the more the pull-up current is channeled from the product line capacitance to the pull-down transistor, which helps to slow down the low-to-high transition. The high-to-low transition creates a situation where the FAMOS cell pulling the line low must sink increasing current with decreasing product line voltage. This sense amplifier operation sacrifices the high-to-low transition speed.

Therefore, a need has arisen to provide a high-speed process tolerate sense amplifier providing a low voltage cutoff to eliminate premature FAMOS data gain.

SUMMARY OF THE INVENTION

In accordance with the present invention, a sense amplifier is provided which substantially eliminates the disadvantages and problems associated with prior sense amplifiers.

The sense amplifier of the present invention is operable to detect the logic state sense node coupled to a plurality of programmable switches selectively enabled by respective input signals. The sense circuitry includes first voltage control circuitry for selectively coupling the sense node to a voltage source responsive to a control signal, feedback circuitry for generating the control signal such that the first voltage control circuitry decouples the sense node from the voltage source responsive to the sense node reaching a predetermined voltage, and second voltage control circuitry to maintain a predetermined voltage on the sense node until one of said programmable switches is enabled.

The sense circuitry of the present invention provides significant advantages over the prior art. Since the first voltage control circuitry is responsive to feedback circuitry, the sense node may be pulled high using a voltage source in excess of the predetermined clamping voltage, resulting in a fast transition. Further, since the first voltage control circuitry may decouple the voltage source from the sense node, a weaker second voltage control circuitry may maintain the predetermined voltage on the sense node, such that a fast high-to-low transition may occur. The present invention is compatible with programmable array logic (PALs) wherein a plurality of programmable switching devices selectively couple a plurality of product lines to a first voltage source under the control of a plurality of inputs. Sensing circuitry associated with each product line includes first voltage control circuitry for selectively coupling the product line to a second voltage source responsive to a control signal, feedback circuitry for generating the control signal responsive to the voltage on the associated product line and second voltage control circuitry to maintain a predetermined voltage on the product line when the product line is not coupled to the first voltage source.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention is best understood by referring to FIGS. 1–4 of the drawings, like numerals being used for like and corresponding parts of the various drawings.

Figure 1A:
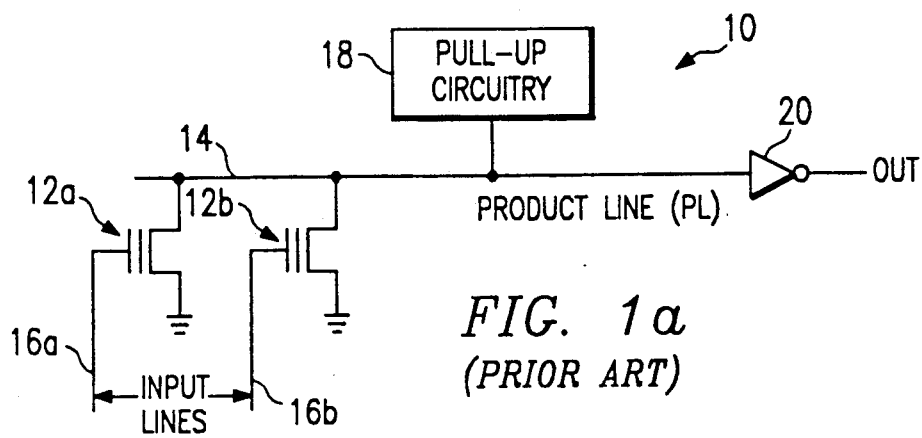
FIGS. 1a–c illustrate prior art sense amplifiers.

FIG. 1a illustrates a block diagram of a sense amplifier, as used in a CMOS programmable array logic (PAL) device. The circuit 10 comprises two FAMOS transistors 12a–b having drains connected to a product line 14, sources connected to ground and gates connected to respective input lines 16a–b of the PAL array. Pull-up circuitry 18 is connected to the product line. An inverter 20 inverts the logical signal on the product line to provide an output signal (OUT).

The FAMOS (floating-gate avalanche MOS) transistor is the programmable element in an EPAL (erasable PAL). The FAMOS transistors 12 operates like normal N-channel MOS transistors when in an erased state. Thus, when the gate of the cell is addressed ( a logical "1" on the input line) the device is turned on and the drain of the cell is connected to ground, thereby producing a logical "0" on the product line 14. Similarly, if the gate of the cell is not addressed (a logical "0" on the input line), the transistor is not conducting and the drain of the cell remains at a logical "1", since the pull-up circuitry 18 forces the product line 14 to a logic high voltage. If the FAMOS transistor 12 was programmed, the threshold voltage of the transistor is shifted such that the transistor will not turn on under normal operation regardless of the logical signal at its input line. Hence, the drain of the programmed FAMOS cell will always be at a logical "1".

Logically, the FAMOS cell 12 acts as an inverter of the input data on the input line 16. Because the drains of multiple transistors 12a–b are tied together on the product line, a logical "0" will predominate over any number of logical "1"s, producing an "AND" function on the inverted input data. The inverter 20 senses the logical value on the product line 14 and outputs the inverted value.

In an actual implementation, the EPAL comprises many product lines 14 and many input lines 16 coupled by FAMOS transistor 12. By performing an OR operation on the outputs of each inverter 20, any SUM-OF-PRODUCTS logic function may be designed by appropriately programming or erasing the FAMOS transistors.

The product line of an EPAL must be less than two volts to prevent accidental programming of the FAMOS transistor 12. Hence, it is important that the pull-up circuitry 18, which governs the voltage of the product line when the FAMOS transistors 12a–b are turned off, accurately maintain a voltage of two volts or less on the product line 14.

Figure 1B:
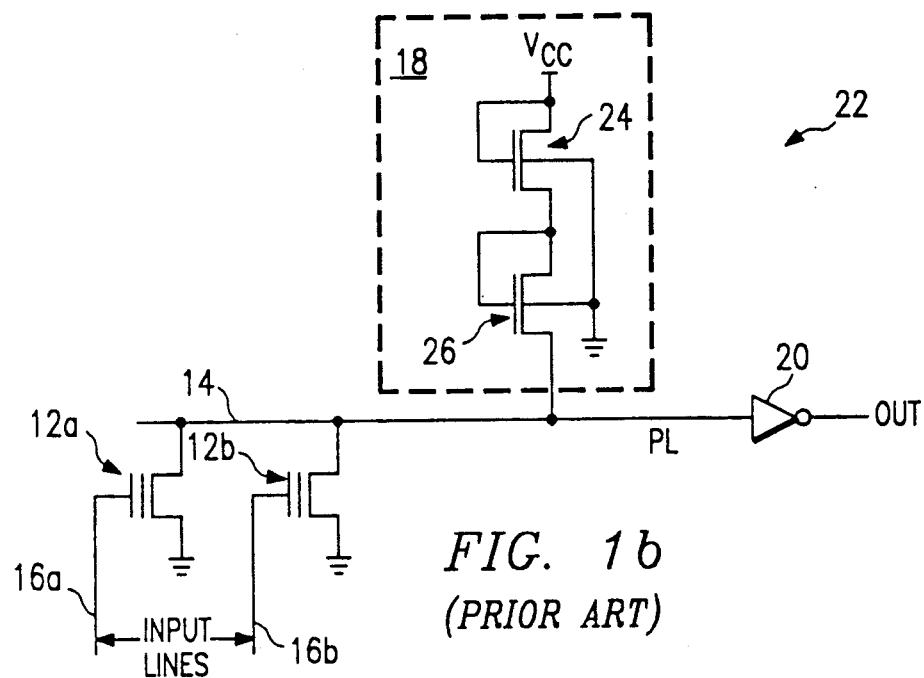

FIG. 1b illustrates a prior art sense amplifier 22. In this sense amplifier, the pull-up circuitry 18 comprises a stacked N-channel transistor pair. The pull-up circuitry 18 comprises N-channel transistors 24 and 26. N-channel transistor 24 has its gate and drain connected to $V_{cc}$. The source of N-channel transistor 24 is connected to the gate and drain of N-channel transistor 26. The source of N-channel transistor 26 is connected to the product line 14. The P-wells of N-channel transistors 24 and 26 are connected to ground.

The pull-up circuit 18 of FIG. 1B will produce a voltage at the product line 14 of $V_{cc}-2V_t$-BE, where BE are the body effects of the transistors 24 and 26. Since the $V_{gs}$ of the transistors 24 and 26 is close to the threshold voltage $V_t$ of the transistors, the operating point of the transistors moves along the edge of the linear and saturated region, operating like a resistive type of pull-up. Therefore, the current supplied by the pull-up will be dependent upon the voltage on the product line. As the voltage on the product line increases, the current supplied by the pull-up decreases. When the product line voltage approaches the clamp voltage (two volts), the current diminishes greatly. This effect may be great enough to skew the output transitions, making the low-to-high transitions slower than the high-to-low transition.

The design shown in FIG. 1b is highly intolerant to process variations. If the drive of the N-channel transistors 24 and 26 are weakened through any form of parameter changes during processing, the performance of the sense amplifier will be greatly altered. The trip-point of the inverter 20 may also be skewed with process variations, which can work against the slowest transition, and may even cause threshold problems.

A second type of prior art sense amplifier is illustrated in connection with FIG. 1c. The sense amplifier 28 includes a pull-up circuit 18 comprising three N-channel transistors 30, 32 and 34 and a P-channel transistor 36. N-channel transistor 30 has a drain connected to $V_{cc}$, a gate connected to a first reference voltage source (REF1), and a source connected to the product line 14. N-channel transistor 32 has a gate and drain connected to the product line and a source connected to ground. N-channel transistor 34 has a gate connected to the product line, a source connected to ground and a drain connected to the drain of P-channel transistor 36 and to the input of inverter 20. The gate of P-channel transistor 36 is connected to a second reference voltage source (REF2) and the source of P-channel transistor 36 is connected to $V_{cc}$. The P-well of N-channel transistor 30 and the N-well of P-channel transistor 36 are connected to $V_{cc}$ and the P-wells of N-channel transistors 32 and 34 are connected to ground.

Figure 1C:
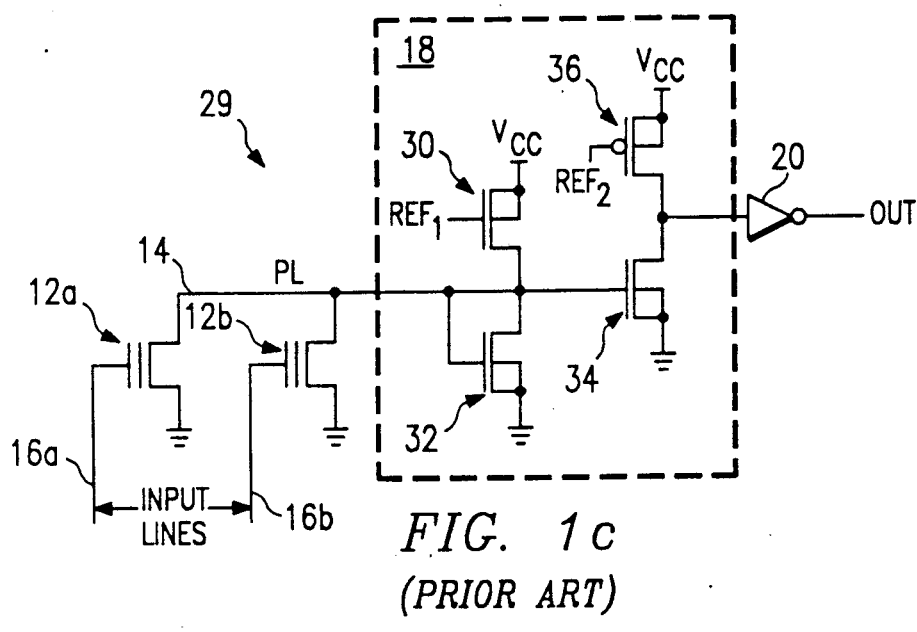

The sense amplifier 28 of FIG. 1c uses a resistor divider type of pull-up to achieve the low voltage "high" required to prevent premature programming of the FAMOS transistors 12a–b. The reference voltage sources (REF1 and REF2) are designed such that their voltage compensates transistors 30 and 36 in accordance with process variations.

In this design, the low-to-high transition is sacrificed by the pull-down resistor divider transistor 32. As the voltage on the product line increases, the current channeled from the product line to the pull-down transistor 32 is increased. The effect is to slow down the low-to-high transition. The high-to-low transition creates a situation where the FAMOS transistors 12a–b must sink increasing current with decreasing product line voltage, which slows the high-to-low transition.

While the reference voltage sources achieve process tolerance, the cost of this feature is increased power dissipation, which is undesirable.

Figure 2A:
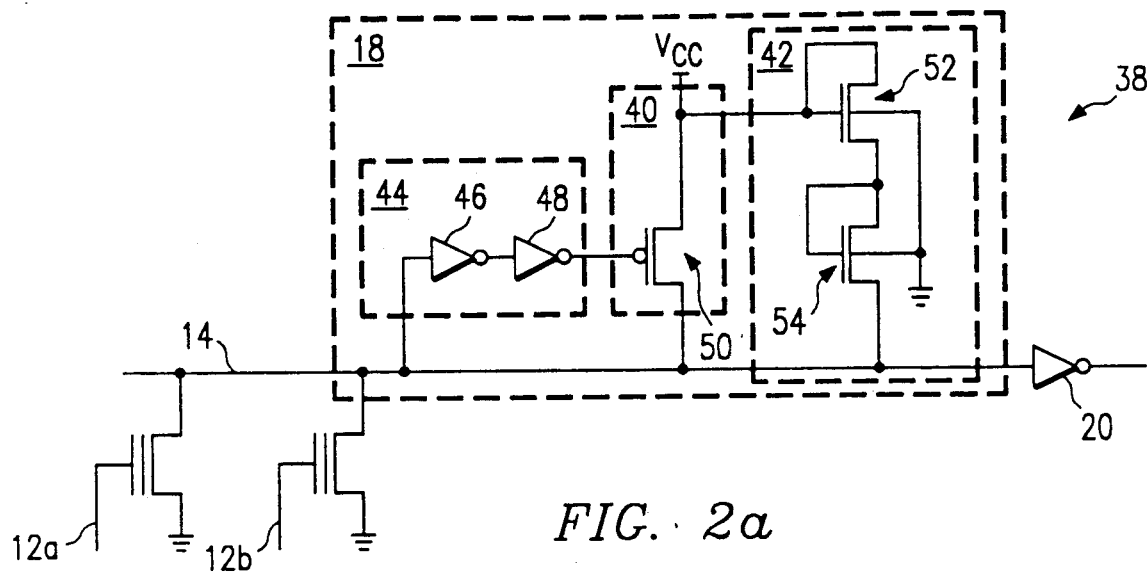
FIG. 2a–b illustrate the sense amplifier of the present invention.

FIG. 2a illustrates a schematic representation of the sense amplifier of the present invention. The sense amplifier 38 includes a pull-up circuit 18 comprising a current source 40, a hold-up circuit 42 and a delay feedback circuit 44. The delay feedback circuit comprises two inverters 46 and 48 connected in serial, the input to inverter 46 connected to the product line 14 and the output of inverter 48 connected to the gate of P-channel transistor 50 which comprises the current source 40. P-channel transistor 50 has a source connected to $V_{cc}$ and the drain connected to the product line 14. Hold-up circuit 42 comprises two N-channel transistors 52 and 54. The gate and source N-channel transistor 52 are connected to $V_{cc}$ and the drain of N-channel transistor 52 is connected to the source and gate of N-channel transistor 54. The drain of N-channel transistor 54 is connected to the product line 14. The P-wells of N-channel transistors 52 and 54 are connected to ground.

In operation, the current source 40 is used for low-to-high transitions, and is shut off by the delay feedback circuit 44 in order to keep the product line voltage from reaching the $V_{cc}$ rail. Additionally, the current source 40 is shut off to improve the high-to-low transition of the product line 14. The hold-up circuit 42 holds the product line voltage at a "high" after the current source 40 is shut off. Since the hold-up circuit 42 is not necessary to pull the product line 14 up during a low-to-high transition, it can be designed to be fairly weak so that the high-to-low transition is not affected.

When the product line 14 is low, the inverters 46 and 48 turn on the P-channel transistor 40, resulting in a constant current into the FAMOS transistor. The P-channel transistor 50 is operating in the saturated region, and hence, not appreciably affected by process variations. When the gates of FAMOS transistors 12a-b are pulled low, the product line voltage will rise until the gate of P-channel transistor 50 rises to a voltage to power-down the P-channel transistor 50. Since the P-channel transistor 50 is heavily loaded due to the product line's capacitance and since the inverters 46 and 48 are lightly loaded, the gate of the P-channel transistor will have a faster rise time than the product line. The thresholds of the inverters 46 and 48 should be set to shut off the current source 40 at the desired product line voltage. This voltage is typically low enough to keep the P-channel transistor constantly saturated, so that maximum current is provided to the product line capacitive load during the low-to-high transition. The hold-up circuit 42 holds the product line at its desired level until the FAMOS cells are again enabled.

Once the FAMOS transistors 12a-b are enabled (assuming one or more of the FAMOS transistors is erased), the FAMOS transistors 12a-b need only sink the weak hold-up circuit 42 and discharge the capacitance on the product line 14, since the current source remains off. Once the product line voltage is below the threshold of the feedback inverters 46 and 48, the P-channel 50 will turn on again. Thus, it is important to adjust the threshold of the feedback inverters against the threshold of the inverter 20 such that the P-channel transistor 50 will not turn on before the FAMOS transistors 12a-b pull the product line below the threshold of inverter 20. In doing so, the fall-time of the product line will be minimized since the FAMOS cells 12a-b remain unloaded by the P-channel throughout the transition.

The following considerations should be taken into account when setting the threshold voltage of the inverter 20. The threshold of inverter 20 should be set between the voltage on the product line with one FAMOS cell turned on and the product line's maximum voltage limit determined by processing. Noise margins should also be taken into consideration and added to the lower voltage limit and subtracted from the upper voltage limit. The threshold of inverter 20 should be set according to the ratio of the size of the P-channel 50 to the size of a single FAMOS transistor. The P-channel transistor 50 always delivers constant saturated current during the low-to-high transition while a single FAMOS transistor will enter its linear region as the voltage of the product line drops. Therefore, the changing drive of a single FAMOS transistor versus the constant drive of a saturated P-channel transistor must be examined for rise and fall times of the product line. If the size of the P-channel transistor 50 and FAMOS transistor 12 are set such that the fall time of the product line is faster than its rise time, then the threshold of the inverter 20 should be set lower to compensate for the variation in transition time; however, the threshold must not be set so low that the P-channel transistor 50 turns on before the FAMOS transistor 12 can pull the product line below inverter 20's threshold.

Process variations have very little affect on the sense amplifier of the present invention. Body effects should not affect the circuit, since all bulks are shorted to their respective rails.

If process variations result in weak P-channels, the current source 40 will have little affect on the P-channel pull-up current, since the different between $V_{gs}$ and $V_t$ will not change significantly as $V_{gs}$ is much greater than $V_t$. Furthermore, weaker P-channel transistors will result in a lower threshold of the inverter 20 to compensate for any slight rise time variation. The threshold of both inverters would be lowered, one offsetting the other. Since the P-channel driver is off during a high-to-low transition, weak P-channel transistors would have only a slight affect during such a transition.

The process variations cause the P-channels to be strong, there will again be little affect on the pull-up current because of the wide differential between $V_{gs}$ and $V_t$. Again, the inverters 46 and 48 will compensate for one another and the threshold of inverter 20 will rise, which will slightly improve the fall-time speed of the product line 14.

If the N-channel transistors are weak, the consequential threshold rise in inverter 20 will make a very slight difference in speed during a low-to-high transition because of the saturated P-channel's current sourcing effect on the product line 14. The transition speed of the product line in a high-to-low transition will be only slightly improved due to the higher threshold of inverter 20 and a weaker hold-up circuit 42. Again, the inverters 46 and 48 will compensate for one another.

If the processing variations cause strong N-channels, the threshold of inverter 20 will fall, slightly improving the low-to-high transition. The lower threshold of inverter 20 and the slightly increased strengthen of the hold-up circuit 42 will slow the fall-time of the product line during a high-to-low transition. Since the P-channel transistor 50 remains off during a high-to-low transition, the circuit will have a very steep fall-time.

If processing variations cause a higher product line capacitance, the product line will rise more slowly. The feedback inverters 46 and 48 will be slowed somewhat, but not at the same rate of the product line slowdown. As a result, a lower maximum voltage for the product line will occur, but the difference should not be significant. The threshold of inverter 20 may be slightly adjusted for capacitance variations.

Another important aspect of the present invention concerns the speed with which it comes out of a zero power state. In a zero power circuit, a control signal is generated in response to a change in one of the input signals. Zero power circuitry could be added to the sense amplifier 28 of FIG. 1c in order to power-down the sense amplifier while no transitions are occuring. However, the two reference signals (REF₁ and REF₂) must also be powered down in a zero power mode. When a power-up pulse is generated in response to an input transition, the reference signals must power-up to allow the sense amplifier 28 to function. The delay associated with a reference signal power-up is much longer than would be necessary if the generated power-up pulse went straight to the sense amplifier. Typically, the zero power TPD of the type of sense amplifier illustrated in FIG. 1c is at least 30% greater than the full power TPD.

It should be noted that the sense amplifier 22 of FIG. 1b does not require reference generators, and therefore allows the power-up pulse to go straight to the sense amplifier 22. However, the lack of process compensation results in serious problems. Also such an application will likely result in the sense amplifier 22 using its slowest (low-to-high) transition when coming out of the zero power state.

Figure 2B:
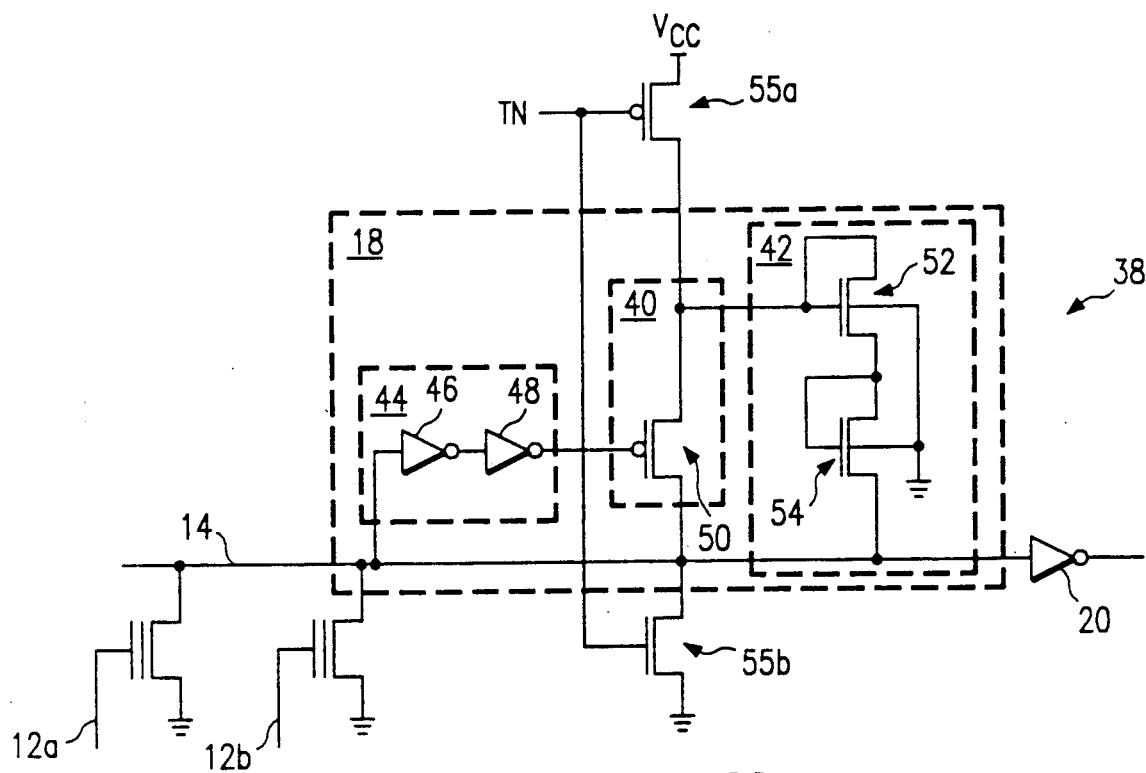

FIG. 2b illustrates an embodiment of the present invention using zero power circuitry. The TN signal produces a pulse which goes low when the chip is powering up. The TN signal is connected to the gates of a P-channel transistor 55a and an N-channel transistor 55b. The source of the P-channel transistor 55a is connected to $V_{cc}$ and the drain of P-channel transistor 55a is connected to the source of P-channel transistor 50. The source of N-channel transistor 55b is connected to ground and the drain of N-channel transistor 55b is connected to the product line 14.

The TN pulse goes low when the chip powers up. The sense amplifier 28 recovers quickly, since no reference signals are needed to achieve process tolerance. If the TN signal can be generated as quickly as data is generated for the inputs 12a–b, then the zero power mode may have the same TPD as the full power mode.

Figure 3:
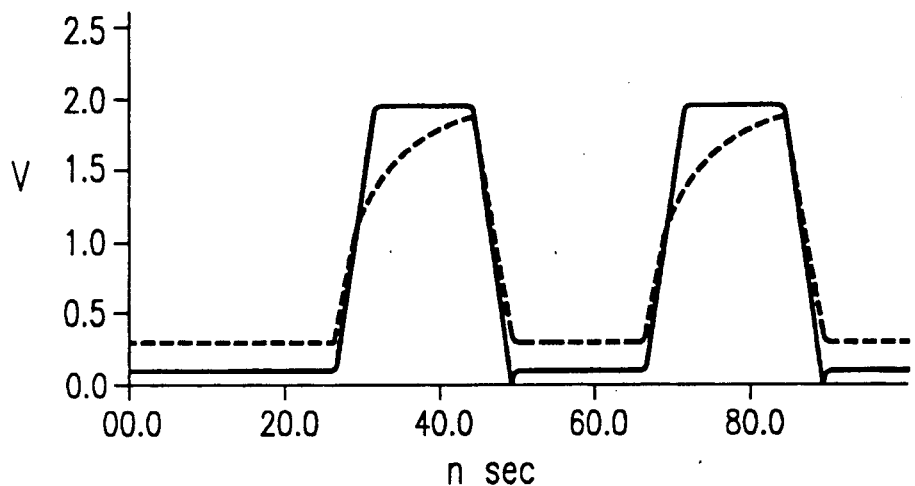
FIG. 3 is a graph of a comparison between the present invention and a prior art sense amplifier.

FIG. 3 illustrates a comparison of the rise and fall times of the sense amplifier of the present invention in comparison with the sense amplifier of the FIG. 1b. As can be seen, the present invention provides very steep rise and fall times whereas the sense amplifier of FIG. 1b has a very damped rise time.

The present invention provides several technical advantages over the prior art. The rise time of the product line is minimized via a constant current source and the fall-time of the product line is minimized by removing the current source from the load. Since the transitions are optimized for speed, process variations will have little, if any, affect on the circuits total propagation delay.

Figure 4:
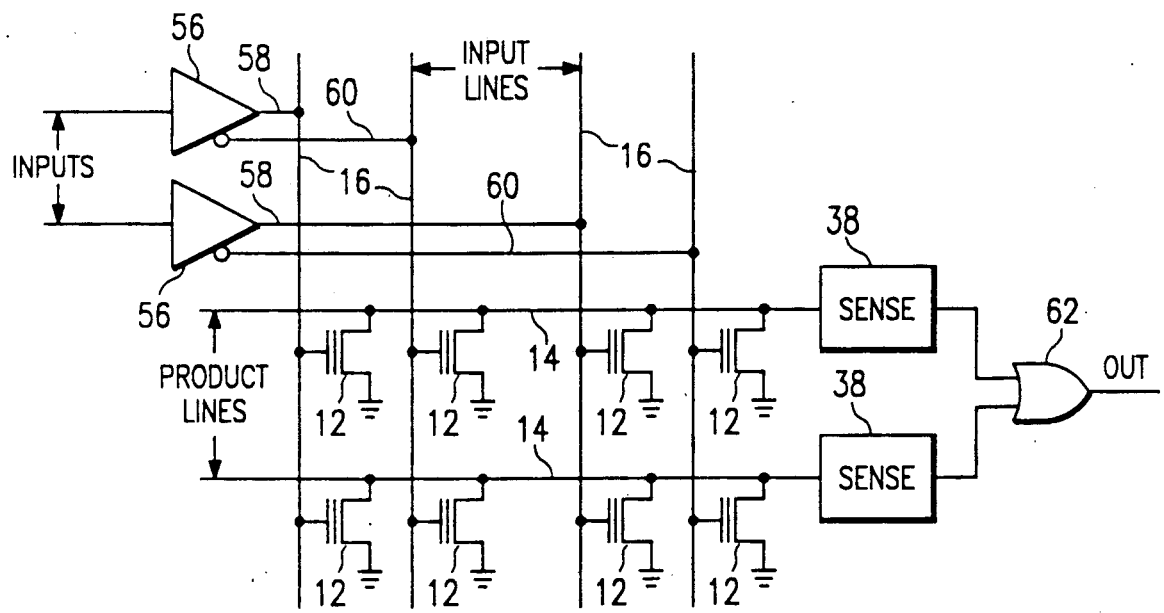
FIG. 4 illustrates a block diagram of the present invention used in an EPAL circuit.

FIG. 4 illustrates a simplified schematic representation of a programmable array logic (PAL) using the present invention. The PAL comprises a plurality of inputs connected to input buffers 56. Input buffers 56 have a TRUE output 58 and a FALSE output 60 (the inverted input). The outputs of the input buffers are connected to the input lines 16. Product lines 14 are connected to the input lines 16 via FAMOS transistors 12. Sense circuitry 38 is associated with each product line 14. The output of sense circuitry 38 is input to an OR gate 62 to provide an output signal (OUT).

While the present invention has been described in conjunction with an EPAL, it may also be used with any design using FAMOS cells or other similar transistors to drive a node to a high or low logic level. Also, a powered CMOS gate may be able to improve its high-to-low transitions using this concept, since the N-channel pull-down transistors may pull the product line low with virtually no load. This would apply to any highly capacitive powered CMOS gate.

Although the present invention has been described in detail, it should be understood that various changes, substitutions and alterations can be made herein without departing from the spirit and scope of the invention as defined by the appended claims.

What is claimed is:

1. A sense circuitry operable to detect the logic state of a sense node coupled to a plurality of programmable switches selectively enabled by respective input signals, comprising:
   first voltage control circuitry for selectively coupling the sense node to a first voltage source responsive to a first control signal;
   feedback circuitry for generating said first control signal such that said first voltage control circuitry decouples the sense node from said first voltage source responsive to said sense node reaching a predetermined voltage; and
   second voltage control circuitry to maintain said predetermined voltage on said source node until one of said programmable switches is enabled wherein said second voltage control circuitry comprises a first N-channel FET, having a gate and a source and a drain disposed in a P-well, and a second N-channel FET, having a gate and a source and a drain disposed in a P-well.

2. The sense circuitry of claim 1 wherein said first voltage control circuitry comprises a first P-channel transistor having a gate connected to said feedback circuitry, a first source/drain connected to said voltage source and a second source/drain connected to said sense node.

3. The sense circuitry of claim 1 wherein said feedback circuitry comprises two inverters.

4. The sense circuitry of claim 2 wherein said feedback circuitry comprises a first inverter having an input coupled to the sense node and said second inverter having an input connected to the output of said first inverter.

5. The sense circuitry of claim 4 wherein said first and second inverters have trip points such that said first P-channel transistor is disabled responsive to said predetermined voltage.

6. The sense circuitry of claim 1 wherein the gate and first source/drain region of said first N-channel transistor is coupled to said first voltage source, the second source/drain of the first N-channel transistor is coupled to the gate and the first source/drain of the second N-channel transistor, and the second source/drain of the second N-channel transistor is coupled to the sense node.

7. The sense circuitry of claim 1 and further comprising an inverter coupled to said sense node.

8. The sense circuitry of claim 1 wherein said programmable switches comprise non-volatile memory cells.

9. The sense circuitry of claim 8 wherein said non-volatile memory cells comprise FAMOS transistors.

10. The sense circuitry of claim 1 and further comprising zero power circuitry operable to disable said first and said second voltage control circuitry responsive to a second control signal.

11. The sense circuitry of claim 10 wherein said zero power circuitry comprises:
   a second P-channel FET, having a gate operable to receive said second control signal, a source coupled to said first voltage source and a drain coupled to said first voltage control circuitry; and
   a third N-channel FET, having a gate coupled to said gate of said second P-channel FET, a source coupled to a second voltage source and a drain coupled to said sense node.

12. A circuit for providing a rapid output transition responsive to an input transition, comprising:
   a sense node;

a floating-gate MOS memory cell coupled to said sense node and operable to selectively couple said sense node to a first voltage source when in a first state and decouple said sense node from said first voltage source when in a second state;

current generating circuitry coupled to said sense node and operable to increase the speed of said sense node transition from a low logic state to a high logic state;

switching circuitry coupled between said sense node and said current generating circuitry responsive to the state of said memory cell and operable to enable and disable said current generating circuitry; and voltage generating circuitry coupled to said sense node responsive to said memory cell output and operable to maintain said sense node in a high logic state while said current generating circuitry is disabled wherein said voltage generating circuitry comprises a first N-channel FET, having a gate and a source and a drain disposed in a P-well, and a second N-channel FET, having a gate and a source and a drain disposed in a P-well.

13. The circuit of claim 12 and further comprising inverter circuitry having an input coupled to said sense node and operable to invert the logic state of said sense node.

14. The circuit of claim 12 wherein said current generating circuitry comprises a first P-channel FET having a gate, a source and a drain.

15. The circuit of claim 14 wherein said gate is coupled to said switching circuitry, said source is coupled to said sense node and said drain is coupled to voltage source $V_{cc}$.

16. The circuit of claim 12 wherein said switching circuitry comprises a first inverter circuitry having a first input and a first output and a second inverter circuitry having a second input and a second output.

17. The circuit of claim 16 wherein said first input is coupled to said sense node, said first output is coupled to said second input, and said second output is coupled to said gate of said P-channel FET.

18. The circuit of claim 12 wherein said gate of said first FET is coupled to $V_{cc}$, said drain of said first FET is coupled to $V_{cc}$, said P-well of said first FET is coupled to said first voltage source, said source of said first FET is coupled to said gate of said second FET, said drain of said second FET is coupled to said gate of said second FET, said P-well of said second FET is coupled to said first voltage source, and said source of said second FET is coupled to said sense node.

19. The circuit of claim 12 and further comprising zero power circuitry operable to disable said current generating circuitry and said voltage generating circuitry responsive to a control signal.

20. The circuit of claim 19 wherein said zero power circuitry comprises:

a second P-channel FET, having a gate operable to receive said control signal, a source coupled to a first voltage source and a drain coupled to said current generating circuitry; and a third N-channel FET, having a gate coupled to said gate of said second P-channel FET, a source coupled to a second voltage source and a drain coupled to said sense node.

21. Programmable array logic comprising:
a plurality of inputs;
a plurality of product lines;
a plurality of programmable switching devices selectively coupling each product line to a first voltage source responsive to an associated input; and sensing circuitry associated with each product line, comprising:

first voltage control circuitry for selectively coupling the product line to a second voltage source responsive to a first control signal;

feedback circuitry for generating said first control signal responsive to the voltage on the associated product line; and second voltage control circuitry to maintain a predetermined voltage on said product line when said product line is not coupled to said first voltage source wherein said second voltage control circuitry comprises a first N-channel FET, having a gate and a source and a drain disposed in a P-well, and a second N-channel FET, having a gate and a source and a drain disposed in a P-well.

22. The programmable array logic of claim 21 wherein said first voltage source is at ground voltage.

23. The programmable array logic of claim 21 wherein said second voltage source is at $V_{cc}$.

24. The programmable array logic of claim 21 wherein said first voltage control circuitry comprises a first P-channel transistor having a gate connected to said feedback circuitry, a first source/drain connected to said second voltage source and a second source/drain connected to said product line.

25. The programmable array logic of claim 24 wherein said feedback circuitry comprises a first and second inverters, each inverter having an input and an output, the input of said first inverter connected to said product line, the output of said first inverter connected to the input of said second inverter and the output of said second inverter connected to the gate of said P-channel transistor.

26. The programmable array logic of claim 21 wherein said programmable switching devices comprise non-volatile memory cells.

27. The programmable array logic of claim 26 wherein said non-volatile memory cells comprise FAMOS transistors.

28. The programmable array logic of claim 21 and further comprising zero power circuitry operable to disable said first and said second voltage control circuitry responsive to a second control signal.

29. The programmable array logic of claim 28 wherein said zero power circuitry comprises:

a second P-channel FET, having a gate operable to receive said second control signal, a source coupled to said second voltage source and a drain coupled to said first voltage control circuitry; and a third N-channel FET, having a gate coupled to said gate of said second P-channel FET, a source coupled to said first voltage source and a drain coupled to said product lines.

30. A method of providing a rapid output transition responsive to an input transition, comprising the steps of:

providing current to a product line during a low-to-high output transition to rapidly increase the voltage on said product line;

disabling said current provision when said product line is at a high logic level to prevent excessive voltage on said product line;

maintaining said product line voltage by generating a predetermined voltage across a first N-channel FET, having a gate and a source and a drain disposed in a P-well, and a second N-channel FET, having a gate and a source and a drain disposed in a P-well; and reenabling said current source when said product line is at a low logic level.

31. The method of claim 30 wherein said step of providing current to said product line comprises the step of enabling a P-channel FET current source coupled to said product line.

32. The method of claim 31 wherein said step of disabling said current provision comprises the step of turning off said P-channel FET current source.

33. The method of claim 32 wherein said step of maintaining the voltage on the product line comprises the step generating a predetermined voltage across two N-channel FETs coupled between said product line and a voltage source.

34. The method of claim 30, further comprising the step of disabling said current provision and said voltage generation responsive to a control signal.

35. A sense circuitry operable to detect the logic state of a sense node coupled to a plurality of programmable switches selectively enabled by respective input signals, comprising:

first voltage control circuitry for selectively coupling the sense node to a first voltage source responsive to a first control signal;

feedback circuitry for generating said first control signal such that said first voltage control circuitry decouples the sense node from said first voltage source responsive to said sense node reaching a predetermined voltage;

second voltage control circuitry to maintain said predetermined voltage on said source node until one of said programmable switches is enabled; and zero power circuitry operable to disable said first and said second voltage control circuitry responsive to a second control signal.

36. A circuit for providing a rapid output transition responsive to an input transition, comprising:

a sense node;

a floating-gate MOS memory cell coupled to said sense node and operable to selectively couple said sense node to a first voltage source when in a first state and decouple said sense node from said first voltage source when in a second state;

current generating circuitry coupled to said sense node and operable to increase the speed of said sense node transition from a low logic state to a high logic state;

switching circuitry coupled between said sense node and said current generating circuitry responsive to the state of said memory cell and operable to enable and disable said current generating circuitry;

voltage generating circuitry coupled to said sense node responsive to said memory cell output and operable to maintain said sense node in a high logic state while said current generating circuitry is disabled; and zero power circuitry operable to disable said current generating circuitry and said voltage generating circuitry responsive to a first control signal.

37. Programmable array logic comprising:

a plurality of inputs;

a plurality of product lines;

a plurality of programmable switching devices selectively coupling each product line to a first voltage source responsive to an associated input; and sensing circuitry associated with each product line, comprising:

first voltage control circuitry for selectively coupling the product line to a second voltage source responsive to a first control signal;

feedback circuitry for generating said control signal responsive to the voltage on the associated product line;

second voltage control circuitry to maintain a predetermined voltage on said product line when said product line is not coupled to said first voltage source; and zero power circuitry operable to disable said first and said second voltage control circuitry responsive to a second control signal.

38. A method of providing a rapid output transition responsive to an input transition, comprising the steps of:

providing current to a product line during a low-to-high output transition to rapidly increase the voltage on said product line;

disabling said current provision when said product line is at a high logic level to prevent excessive voltage on said product line;

maintaining said product line voltage using a voltage generator;

reenabling said current source when said product line is at a low logic level; and disabling said current provision and said product line voltage maintenance in response to a control signal.

* * * * *